United States Patent
MacDonald et al.

(10) Patent No.: US 9,825,218 B2
(45) Date of Patent: Nov. 21, 2017

(54) TRANSISTOR THAT EMPLOYS COLLECTIVE MAGNETIC EFFECTS THEREBY PROVIDING IMPROVED ENERGY EFFICIENCY

(71) Applicant: Board of Regents, The University of Texas System, Austin, TX (US)

(72) Inventors: Allan MacDonald, Austin, TX (US); Leonard Franklin Register, II, Austin, TX (US); Emanuel Tutuc, Austin, TX (US); Inti Sodemann, Austin, TX (US); Hua Chen, Austin, TX (US); Xuehao Mou, Austin, TX (US); Sanjay K. Banerjee, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/881,372

(22) Filed: Oct. 13, 2015

(65) Prior Publication Data
US 2017/0104151 A1  Apr. 13, 2017

(51) Int. Cl.
*H01L 43/00* (2006.01)
*H01L 43/06* (2006.01)
(Continued)

(52) U.S. Cl.
CPC ............ *H01L 43/065* (2013.01); *H01L 43/04* (2013.01); *H01L 43/10* (2013.01)

(58) Field of Classification Search
CPC .................................................. H01L 43/065
See application file for complete search history.

(56) References Cited

U.S. PATENT DOCUMENTS

2008/0308844 A1* 12/2008 Koo .................. G11C 11/16
                                                       257/192
2009/0016098 A1*  1/2009 Wunderlich ......... G11C 11/16
                                                       365/158
(Continued)

OTHER PUBLICATIONS

International Search Report and Written Opinion for International Application No. PCT/US2016/056241 dated Dec. 19, 2016, pp. 1-11.

*Primary Examiner* — William Harriston
(74) *Attorney, Agent, or Firm* — Robert A. Voigt, Jr.; Winstead, P.C.

(57) ABSTRACT

A device or class of devices that provides a mechanism for controlling charge current flow in transistors that employs collective magnetic effects to overcome voltage limitations associated with single-particle thermionic emission as in conventional MOSFETs. Such a device may include two or more magnetic stacks with an easy-in-plane ferromagnetic film sandwiched between oppositely magnetically oriented perpendicular magnetization anisotropy (PMA) ferromagnets. Each stack includes two non-magnetic layers separating the easy-plane ferromagnetic film from the PMA layers. Charge current flow through one of these stacks controls the current-voltage negative differential resistance characteristics of the second stack through collective magnetic interactions. This can be exploited in a variety of digital logic gates consuming less energy than conventional CMOS integrated circuits. Furthermore, the easy-in-plane magnetic films may be subdivided into regions coupled through exchange interactions and the in-plane fixed magnetic layers in the input magnetic stacks can be used in non-volatile logic and memory.

22 Claims, 6 Drawing Sheets

(51) Int. Cl.
    *H01L 43/04*    (2006.01)
    *H01L 43/10*    (2006.01)

(56)     References Cited

U.S. PATENT DOCUMENTS

| | | |
|---|---|---|
| 2010/0102319 A1 | 4/2010 | Xie |
| 2012/0112189 A1 | 5/2012 | Xie |
| 2012/0126904 A1 | 5/2012 | Lee et al. |
| 2012/0243308 A1 | 9/2012 | Saida et al. |
| 2013/0201754 A1 | 8/2013 | Yu et al. |
| 2013/0299880 A1 | 11/2013 | Du |
| 2014/0124882 A1 | 5/2014 | Khalili Amiri et al. |
| 2014/0170779 A1 | 6/2014 | Kelber et al. |
| 2015/0179245 A1 | 6/2015 | Alvarez-Herault et al. |
| 2015/0236247 A1 | 8/2015 | Behin-Aein et al. |

\* cited by examiner

TRANSISTOR THAT EMPLOYS COLLECTIVE MAGNETIC EFFECTS THEREBY PROVIDING IMPROVED ENERGY EFFICIENCY

TECHNICAL FIELD

The present invention relates generally to transistors, and more particularly to a transistor that employs collective magnetic effects to overcome voltage limitations associated with single-particle thermionic emission as in complementary metal oxide semiconductor (CMOS) field-effect transistor (FET) based logic thereby providing improved energy efficiency as well as to a transistor with a non-volatile memory capability for memory or non-volatile logic applications.

BACKGROUND

Complementary metal oxide semiconductor (CMOS) technology, employing complementary n-channel and p-channel metal-oxide-semiconductor field-effect transistors (MOSFETs), is a technology for constructing integrated circuits. CMOS technology is used in microprocessors, microcontrollers, static RAM, and other digital logic circuits. CMOS technology is also used for analog circuits, such as image sensors (e.g., CMOS sensor), data converters, and highly integrated transceivers for many types of communication.

The words "complementary," "n-type" and "p-type" refer to the fact that the typical digital design style with CMOS use complementary combinations of MOSFETs that have charge conduction channels that carry negatively charged electron electrons, commonly known as "n-type," and MOSFETs that have charge conduction channels that carry positively charged holes, commonly known as "p-type."

Two important characteristics of CMOS devices are high speed and low static power consumption. Since there is always one transistor in series that is in its off state under static conditions, CMOS circuit elements draw relatively little power under static conditions. Only momentarily during switching between on and off states is power consumption large. Consequently, CMOS devices do not consume as much energy and produce as much heat as many other forms of logic, for example, transistor-transistor logic (TTL) or NMOS (n-channel MOSFET) logic, which normally have significant standby current even when not changing state combined with significant voltages. CMOS also allows a high density of logic functions on a chip. It was primarily for these reasons that CMOS became the most widely implemented technology in VLSI chips.

Another characteristic of CMOS is that it is volatile in that once the power source is removed, the logic state is lost, both for CMOS logic circuit and CMOS based memory elements.

A characteristic of non-volatile memory is relatively large power consumption per bit as compared to logic.

Despite the benefits of CMOS, there is a need to continue to increase energy efficiency to enable still lower power circuits for mobile application and energy-hungry applications, as well as greater packing density, which can be limited by heating, for increased computational power in logic circuits. Moreover, with logic circuits frequently powered on and off as needed with logic states off-loaded to and retrieved from memory, non-volatile logic becomes attractive. Mechanisms for low-power non-volatile memory also are of general interest. With the advent of low voltage logic, as described herein or by other means, low power non-volatile memory operating on compatible voltage scale would be more beneficial still.

BRIEF SUMMARY

In one embodiment of the present invention, a transistor comprises an easy-plane ferromagnetic film with an orientation along an easy axis within a plane of a ferromagnetic driven by vertical charge transport through a first and a second magnetic stack. The transistor further comprises the first magnetic stack comprising a first and a second non-magnetic layer surrounding the easy-plane ferromagnetic film, where the first magnetic stack further comprises a first and a second ferromagnetic layer with perpendicular anisotropy on an outside of the first and second non-magnetic layers. The transistor additionally comprises the second magnetic stack comprising a third and a fourth non-magnetic layer surrounding the easy-plane ferromagnetic film, where the second magnetic stack further comprises a third and a fourth ferromagnetic layer with perpendicular anisotropy on an outside of the third and fourth non-magnetic layers. Furthermore, the transistor comprises input terminals connected to the first and second ferromagnetic layers of the first magnetic stack. Additionally, the transistor comprises output terminals connected to the third and fourth ferromagnetic layers of the second magnetic stack. In response to exceeding a critical current, the easy-plane ferromagnetic film produces an oscillatory precession about an out-of-plane axis by driving a current through the first and second magnetic stacks thereby increasing interlayer resistance of the first and second magnetic stacks and reducing current flow through the first and second magnetic stacks. The critical current corresponds to a conserved quantity with respect to a sum of current flows through an upper output terminal and an upper input terminal in response to the first and third ferromagnetic layers of the first and second magnetic stacks, respectively, having a same magnetic orientation, or corresponds to a conserved quantity with respect to a sum of current flows through the upper output terminal and a lower input terminal in response to the first and third ferromagnetic layers of the first and second magnetic stacks, respectively, having a different magnetic orientation.

In another embodiment of the present invention, a transistor comprises an easy-plane ferromagnetic film with an orientation along an easy axis within a plane of a ferromagnetic driven by vertical charge transport through a first and a second magnetic stack, where the easy-plane ferromagnetic film comprises two or more regions each of which individually approximates a macrospin. The transistor further comprises the first magnetic stack comprising a first and a second non-magnetic layer surrounding the easy-plane ferromagnetic film, where the first magnetic stack further comprises a first and a second easy-plane ferromagnetic layer on an outside of the first and second non-magnetic layers. The transistor additionally comprises the second magnetic stack comprising a third and a fourth non-magnetic layer surrounding the easy-plane ferromagnetic film, where the second magnetic stack further comprises a third and a fourth ferromagnetic layer with perpendicular anisotropy on an outside of the third and fourth non-magnetic layers. Furthermore, the transistor comprises input terminals connected to the first and second ferromagnetic layers of the first magnetic stack. Additionally, the transistor comprises output terminals connected to the third and fourth ferromagnetic layers of the second magnetic stack. An output current of the transistor is controlled via an input current, where the input current sets a magnetic orientation of a first region of the easy-plane ferromagnetic film via spin transfer torque. A magnetic orientation of the first region of the easy-plane ferromagnetic film increases a strength of a magnetic orientation of a second region of the easy-plane ferromagnetic film in response to the first region of the easy-plane ferromagnetic film being aligned with the magnetic orientation of the second region of the easy-plane ferromagnetic film thereby increasing a critical current for subsequent current flow between the output terminals or decreases a strength of the magnetic orientation of the second region of the easy-plane ferromagnetic film in response to the first region of the easy-plane ferromagnetic film being oppositely aligned with the magnetic orientation of the second region of the easy-plane ferromagnetic film thereby reducing the critical current for subsequent current flow between the output terminals. In response to exceeding the critical current, the easy-plane ferromagnetic film produces an oscillatory precession about an out-of-plane axis by driving a current through the second magnetic stack thereby increasing interlayer resistance of the second magnetic stack and reducing current flow through the first and second magnetic stacks thereby producing a corresponding negative differential resistance.

The forgoing has outlined rather generally the features and technical advantages of one or more embodiments of the present invention in order that the detailed description of the present invention that follows may be better understood. Other variations and additional features and advantages of the present invention will be described hereinafter which may form the subject of the claims of the present invention. One important variation is that an easy-plane antiferromagnetic layer can be substituted for the easy-plane ferromagnetic layer.

BRIEF DESCRIPTION OF THE DRAWINGS

A better understanding of the present invention can be obtained when the following detailed description is considered in conjunction with the following drawings, in which.

DETAILED DESCRIPTION

Figure 1A:
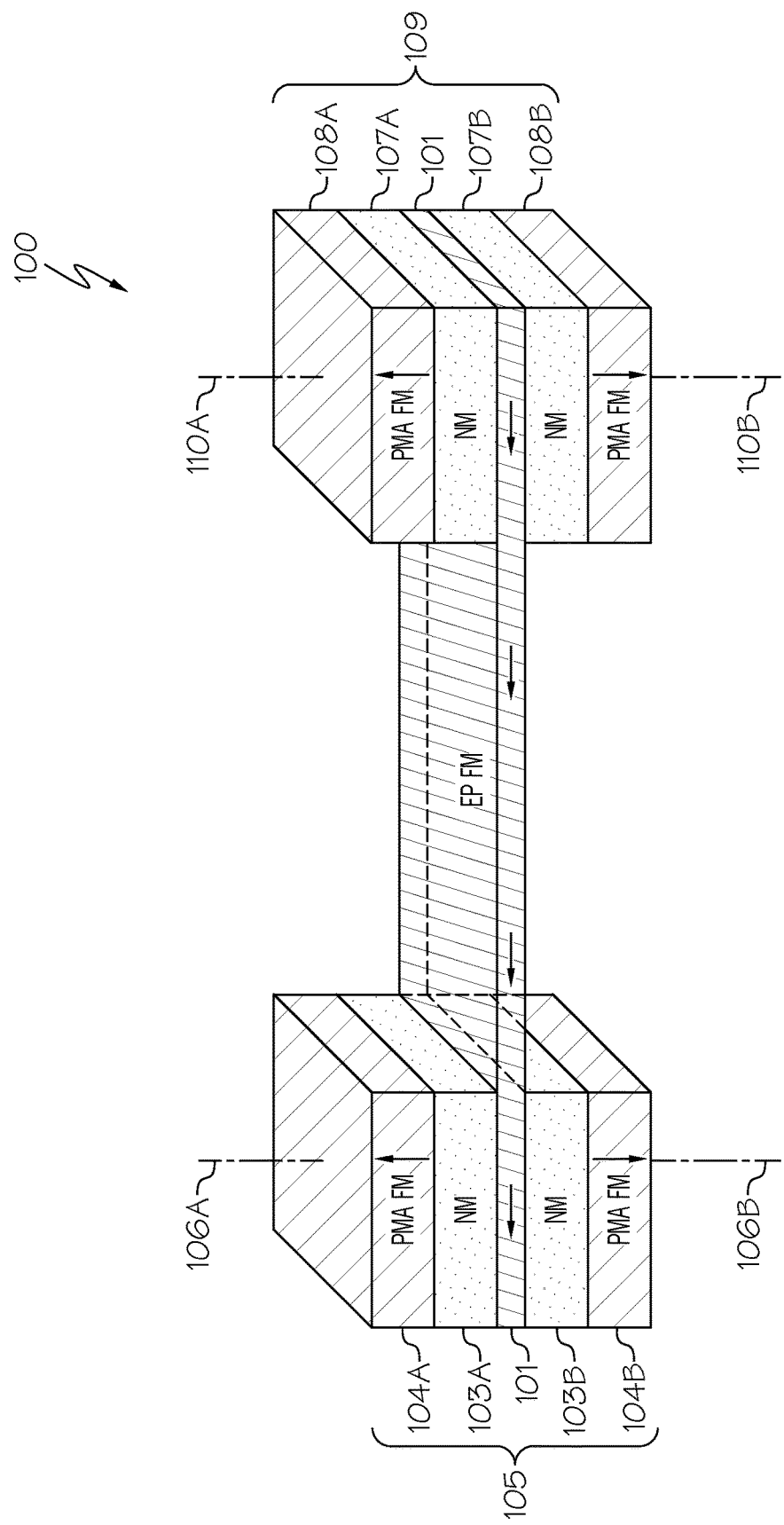
FIG. 1A illustrates the current-controlled version of the Bi-Stack Magnetic Transistor ("C-BiSMaT") which has low-voltage logic applications in accordance with an embodiment of the present invention.

The principles of the present invention include two embodiments of a common transistor theme, referred to herein as the "Bi-Stack Magnetic Transistor" (BiSMaT). Both embodiments of the BiSMaT are intended to allow lower voltage, lower power memory and logic operation than possible with currently used complementary metal oxide semiconductor (CMOS) field-effect transistor (FET) based logic. Increased energy efficiency is not only important for its own sake, but also is necessary in logic circuits to enable increased device packing density and the resulting increase in computational power. Recent progress in the growth of magnetic thin films has made it possible to construct circuits in which materials with perpendicular and in-plane magnetic anisotropy are flexibly combined. This progress has improved prospects for the experimental realization of a new class of effects in spintronics in which collective magnetic degrees of freedom play a more active role than they do in memory devices based on magnetoresistance.

For the in-plane (XY) ferromagnets, the energy of the ferromagnetically-ordered state is weakly dependent of the azimuthal (in plane) magnetic orientation angle as compared to the polar (out of plane) magnetic orientation angle. In the devices discussed herein, this angle plays a role similar to the Cooper pair phase degree-of-freedom in a superconductor. In the two cases, states with a definite value of the angle variables break spin-rotational symmetry around the z-axis and gauge symmetry, respectively. The analogy between XY ferromagnetism and superconductivity extends to superflow behavior. Just as superconductors can support dissipationless charge currents, perfect easy-plane ferromagnets can support dissipationless currents of the conserved z component of total spin. This property is one of the physical principles behind the present invention described herein and is responsible for the non-local interaction between the two metallic stacks.

As discussed herein, the transistors of the present invention rely on the ability to switch the collective spin in ferromagnetic materials with strong easy-plane order from steady state behavior to time-dependent/dynamic precessional behavior, and on the associated influence on charge transport through the layer. When the transition occurs, the conductance through the output terminals can drop substantially. With one or more inputs to control the point at which the transition occurs, these transistors can be used to form Boolean logic circuits, both by using combinations of these transistors and/or by using multiple inputs to the same "transistor."

Two variations on this theme are considered. The first variation, referred to herein as the "C-BiSMaT," an input current is used directly for control of the transition of the output current. In the second variation, referred to herein as the "F-BiSMaT," an input current adjusts the magnetic orientation of an input ferromagnet. Exchange or magnetic coupling then allows that ferromagnet to adjust the critical output current.

Referring now to the Figures, FIG. 1A illustrates the current-controlled version of the Bi-Stack Magnetic Transistor ("C-BiSMaT") 100 in accordance with an embodiment of the present invention. C-BiSMaT 100 includes a single easy-plane (EP) ferromagnetic (FM) thin film 101 with preferred orientation along an easy axis within the plane of the ferromagnet driven by vertical charge transport through two (as shown here) or more thin film magnetic stacks 105 and 109 that contain perpendicular anisotropy magnetic (PMA) layers. It is this basic geometry that inspires the BiSMaT moniker.

As further illustrated in FIG. 1A, magnetic stack 105 includes non-magnetic (NM) metallic layers 103A, 103B surrounding easy-plane ferromagnetic thin film 101. It is noted that easy-plane ferromagnetic thin film 101 may be referred to herein as easy-plane ferromagnet layer 101 or central ferromagnetic layer 101. Furthermore, magnetic stack 109 includes non-magnetic metallic layers 107A, 107B surrounding the easy-plane ferromagnetic thin film 101. Non-magnetic layers 103A, 103B may be referred to collectively or individually as non-magnetic layers 103 or non-magnetic layer 103, respectively. Furthermore, non-magnetic layers 107A, 107B may be referred to collectively or individually as non-magnetic layers 107 or non-magnetic layer 107, respectively.

Additionally, as illustrated in FIG. 1A, magnetic stack 105 includes ferromagnetic layers 104A, 104B with perpendicular magnetic anisotropy (PMA) on the outside of non-magnetic layers 103. Furthermore, magnetic stack 109 includes ferromagnetic layers 108A, 108B with PMA on the outside of non-magnetic layers 107. Ferromagnetic layers 104A, 104B may be referred to collectively or individually as ferromagnetic layers 104 or ferromagnetic layer 104, respectively. Furthermore, ferromagnetic layers 108A, 108B may be referred to collectively or individually as ferromagnetic layers 108 or ferromagnetic layer 108, respectively.

Furthermore, as shown in FIG. 1A, ferromagnetic layers 104A, 104B have opposite magnetic orientations (see arrows pointing in opposite direction in FIG. 1A). Furthermore, as shown in FIG. 1A, ferromagnetic layers 108A, 108B have opposite magnetic orientations (see arrows pointing in opposite direction in FIG. 1A). Furthermore ferromagnetic layer 104A and ferromagnetic layer 108A may have the same or opposite orientations, and, thus, ferromagnetic layer 104B and ferromagnetic layer 108B may also have the same or opposite orientations, correspondingly.

Additionally, as illustrated in FIG. 1A, magnetic stack 105 has output terminals 106A, 106B, respectively. Output terminals 106A, 106B may collectively or individually be referred to as output terminals 106 or output terminal 106, respectively. Furthermore, as illustrated in FIG. 1A, magnetic stack 109 has input terminals 110A, 110B, respectively. Input terminals 110A, 110B may be referred to collectively or individually as input terminals 110 or input terminal 110, respectively.

It is noted that various materials can be employed. In one embodiment, easy-plane ferromagnet 101 is composed of a metal (e.g., iron, cobalt, nickel). In another embodiment, ferromagnet 101 is composed of a ferromagnetic insulator (e.g., yttrium iron garnet (YIG)). In another embodiment, ferromagnet 101 is composed of a combination of metals and ferromagnetic insulators. In a further embodiment, easy-plane ferromagnet 101 is composed of an alloy (e.g. permalloy (nickel-iron (Ni—Fe))). In a further embodiment, ferromagnet 101 is composed of a layer structure, such as cobalt (Co) on platinum (Pt) or cobalt-platinum multilayers. In one embodiment, non-magnetic layers 103A, 103B, 107A, 107B are composed of a metal (e.g., copper, gold) or an insulator (e.g., magnesium oxide (MgO)). In one embodiment, the PMA ferromagnetic layers 104A, 104B, 108A, 108B are composed of a metal (e.g., iron, cobalt, nickel), a ferromagnetic insulator (e.g., yttrium iron garnet (YIG)), an alloy (e.g. permalloy), or a layer structure (e.g., cobalt (Co) on platinum (Pt), cobalt-platinum multilayers). It is noted that the principles of the present invention are not to be limited in scope to the materials discussed above for magnetic stacks 105, 109 and that other materials may be utilized.

Furthermore, various geometries can be employed. In one embodiment, central easy-plane ferromagnetic layer 101 may be rectangular in the plane. In one embodiment, central easy-plane ferromagnetic layer 101 may be oval in the plane. The principles of the present invention are not to be limited in scope to having central easy-plane ferromagnetic layer 101 being rectangular or oval in the plane. Other geometries for central easy-plane ferromagnetic layer 101 may be utilized.

In one embodiment, beyond the central easy-plane layer, magnetic stacks 105, 109 may be rectangular in the plane. In one embodiment, beyond the central easy-plane layer, magnetic stacks 105, 109 may be round in the plane. The principles of the present invention are not to be limited in scope to having magnetic stacks 105, 109 being square or round in the plane beyond the central easy-plane layer. Other geometries for magnetic stacks 105, 109 beyond the central easy-plane layer may be utilized.

In the easy-plane ferromagnetic thin film 101, magnetic anisotropy, such as shape anisotropy for rectangular or oval ferromagnetic layers, is assumed to produce an easy axis for magnetization within the plane. Small conductance for lateral transport between magnetic stacks 105 and 109 as compared to the conductances for vertical transport within magnetic stack 105 or within magnetic stack 109 can limit cross talk between thin film magnetic stacks 105, 109, which is desirable for circuit functionality. In the C-BiSMaT of FIG. 1A, such a limitation of cross talk would result because conductance is proportional to the cross section divided by the transport distance, which is substantially smaller between magnetic stacks 105, 109, than within each magnetic stack 105, 109. Surface effects can further degrade in-plane conductance between the magnetic stacks. Vertical charge transport within the magnetic stacks is also limited by interface resistance. The spin-transfer torques exerted by vertical charge transport drive spin-currents through easy-plane ferromagnet 101, and induce non-local effects that are much stronger than the familiar effects associated with spin-diffusion. If the spin-stiffness in a ferromagnet is strong enough to inhibit spatial variation in magnetic orientation, as in the small (lateral dimensions on the scale of 10s of nanometers) thin-film (less than approximately five nanometers thickness) ferromagnets envisioned for this purpose, all the spins act collectively as a so-called macrospin. Moreover, because they are separated by non-magnetic spacer layers 103, 107, the macrospin of central easy-plane ferromagnetic layer 101 can precess independently of the macrospins of the other magnetic elements 104, 108. Up to a point, when the critical current is reached, voltages applied across the thin film magnetic stacks 105, 109 produce only a constant shift in the magnetic orientation of the macrospin of central ferromagnetic layer 101 away from its easy axis, which has little or no effect on the (z-direction) resistance through thin film magnetic stacks 105,109. However, beyond that point, the macrospin of easy-plane ferromagnetic 101 begins a rapid oscillatory precession about an out-of-plane axis by driving a current through magnetic stacks 105, 109 that increases the interlayer resistance of thin film magnetic stacks 105, 109, reducing the current flow through the magnetic stacks thereby producing a negative differential resistance. Specifically, the rapid precession reduces the time-average interlayer conductance through a process known as spin-pumping, which opposes charge transport in this geometry. Moreover, the critical current is a conserved quantity with respect to central ferromagnetic layer 101 as a whole under the specified condition of strong spin-stiffness, such that with separate output and input terminals 106, 110, respectively, as shown, the current into the terminal changes the apparent critical current seen at the other terminal. More precisely, the critical current is a conserved quantity with respect to the sum of the current flowing into the upper output contact 106A and upper input contact 110A if the "upper" PMA ferromagnets 104A, 108A have the same magnetic orientation, and, thus, the "lower" fixed ferromagnets 104B, 108B also have the same magnetic orientation. The critical current is a conserved quantity with respect to the sum of the current flowing into the upper output contact 106A and lower input contact 110B if the "upper" PMA ferromagnets 104A, 108A have opposite magnetic orientations, and, thus, the "lower" ferromagnets 104B, 108B also have opposite magnetic orientations. As a result, by changing the current through input terminals 110, the apparent critical current for current through output terminals 106 changes. The effect is strengthened when the Gilbert damping in the central easy-plane layer 101 is small. The effect is strengthened when the electrons involved in transport, such as those near the Fermi level, which are injected into and extracted from central ferromagnetic layer 101 on opposite sides of the layer, are increasingly spin-polarized in the perpendicular direction with respect to the easy-plane of central ferromagnetic layer 101, and when the injected and extracted electrons have opposite spin polarization. The oppositely magnetically oriented pairs of ferromagnetic layers with PMA 104A, 104B and 108A, 108B, respectively, maximize the spin polarization orientations of the injected and extracted electrons toward this ideal.

It is noted that the "fixed" ferromagnetic layers 104A, 104B, 108A, 108B have their magnetic orientations set at some point prior to being used, such as before their first use. Referring to FIG. 1A, in one embodiment, output PMA ferromagnetic layers 104A, 104B require different magnetic fields to set the "fixed" magnetic orientations of these layers thereby allowing their opposite magnetic orientations to be set more readily. Referring to FIG. 1A, in one embodiment, input PMA ferromagnetic layers 108A, 108B require different magnetic fields to set the "fixed" magnetic orientations of these layers thereby allowing their opposite magnetic orientations to be set more readily.

Figure 1B:
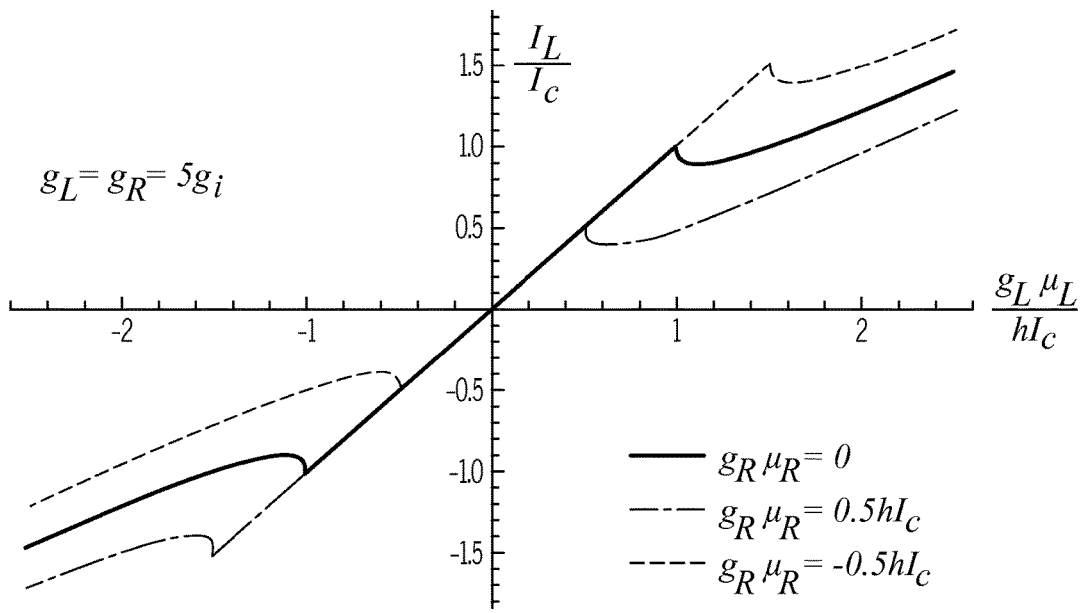
FIG. 1B is a graph of the time average/DC current-voltage characteristics for the left-side (output side) current $I_r$ as a function of the applied right-side chemical potential drop $\mu_R$ (proportional to the voltage drop) in accordance with an embodiment of the present invention.
Figure 1C:
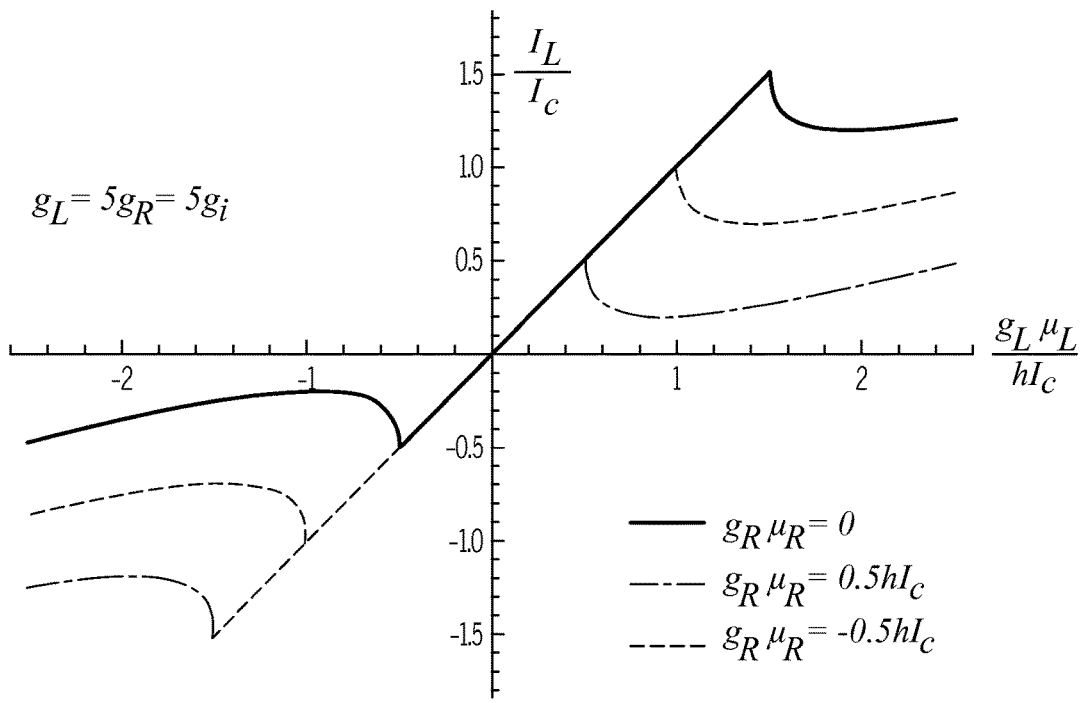
FIG. 1C is a graph of the time average/DC current-voltage characteristics for the left-side (output side) current $I_r$ as a function of the applied right-side chemical potential drop $\mu_R$ (proportional to the voltage drop) when the "output" current/conductance is controlled via an "input" current in accordance with an embodiment of the present invention.

Referring to FIGS. 1B and 1C in conjunction with FIG. 1A, FIGS. 1B and 1C are graphs of the estimated time average/DC current-voltage characteristics for the left-side (output side) current $I_L$ as a function of the applied left-side chemical potential drop $\mu_L$ (proportional to the voltage drop) for three different values of the right-side (input side) chemical potential $\mu_R$ in accordance with two embodiments of the present invention. $g_L$ is the conductance for current flow through the output-side (left side) of magnetic stacks 105 through output terminals 106 weighted by the spin injection efficiency in the non-precessing state. $g_R$ is the conductance for current flow through the input-side (right side) of magnetic stacks 109 through input terminals 110 weighted by the spin injection efficiency in the non-precessing state. $g_i$ represents the Gilbert damping. $I_c$ is the conserved critical current. The shown current-voltages characteristics are for the combination of magnetic orientations in PMA layers 104A, 104B, 108A, 108B illustrated in FIG. 1A. Under bias, the magnetic orientation in central ferromagnetic layer 101 is altered by current flow, ultimately varying rapidly in time once the conserved critical current $I_C$ is reached, and leading to the shown drops in the time-averaged DC current near $I_C$. FIG. 1B is a graph of the estimated output current flow for one embodiment where $g_L=g_R=5g_i$. FIG. 1C is a graph of the estimated output current flow for one embodiment where $g_L=5g_R=5g_i$. The change in apparent critical current as seen at the output terminals (the location of the onset of reduced conductance) as a function of the input side chemical potential $\mu_R$ is evident. Moreover, as seen by comparison between FIG. 1B and FIG. 1C, having a greater conductance on the output side increases the change in the DC conductance about the critical current.

In one embodiment, the conductance of the output magnetic stack 110 $g_L$ is increased relative to the conductance of the input magnetic stack 105 $g_R$ by increasing the in-plane area of the output stack relative to the in-plane area of the input magnetic stack. Increasing the conductance of output magnetic stack $g_L$ relative to the conductance of the input magnetic stack $g_L$, and altering the relative cross-sectional areas of the magnetic stack to achieve such relative changes in the conductances $g_L$ and $g_L$ are illustrative and should not be considered exclusive.

The voltage range over which the high-to-low conductance transition occurs is expected to be on the scale of $e\delta V/k_BT \sim 1(g_L+g_R)$, where $k_B$ is Boltzmann's constant, T is the temperature, g is conductance in units $e^2/h$, where e is the electron charge and h is Planck's constant. In the indicated lateral device size range, $g_{L,R}$ can be on the scale of >100,000. In this case, the operating voltages could be on the scale of microvolts at room temperature In one embodiment of the BiSMaT, one or more dielectric tunnel barriers are used within the nominally magnetic stacks 105 and 109 in lieu of, or in addition to, the non-ferromagnetic layers 103, 107 to decrease the conductances $g_L$ and $g_R$ and to adjust the transition voltage $\delta V$ upward to within a higher desired voltage range, such as to address noise considerations. The use of dielectric tunnel barriers to decrease the conductances $g_L$ and $g_R$ is illustrative and should not be considered exclusive.

In one embodiment, central easy-plane thin film ferromagnet of layer 101 is composed of a nonmetallic material rather than a metallic material. Use of a non-metallic layer would reduce the conductances $g_L$ and $g_R$, and, thus, increase the required operating voltage substantially, which might or might not be beneficial for various applications. Moreover, nonmetallic ferromagnets generally have much smaller Gilbert damping coefficients than metallic ferromagnets, which would increase the ratio between the DC conductance prior to reaching the critical current and that after reaching the critical current.

In one embodiment, central easy-plane thin film ferromagnet of layer 101 is composed of a metallic or nonmetallic antiferromagnetic material rather than a ferromagnetic material. Antiferromagnetic materials have the advantage that they have more rapid precessional dynamics. Less time is therefore required to establish a well-defined time-averaged current. This embodiment will be advantageous when rapid device speed is desirable.

In one embodiment, thin film ferromagnetic layer 101 is composed of a nonmetallic material with one or more metallic ferromagnetic vias coupling metallic layers 103A, 103B through the otherwise nonmetallic ferromagnet, and with one or more metallic ferromagnetic vias coupling metallic layers 107A, 107B through the otherwise nonmetallic ferromagnet. The host nonmetallic ferromagnetic film and the metallic vias should be strongly exchange coupled so that the combination continues to approximate a single macrospin. This latter approach would still provide a reduced Gilbert damping coefficient (if less so than for a pure insulating ferromagnetic layer 101) while maintaining high conductivities $g_L$ and $g_R$. In one embodiment, thin film nonmetallic layer 101 consists of YIG (yttrium iron garnet). In one embodiment, thin film nonmetallic layer 101 consists of an insulating antiferromagnet. In one embodiment, the metallic ferromagnetic vias are composed of permalloy (Ni—Fe).

Although the basic structure as described above and illustrated in FIG. 1A currently seems to be the most promising C-BiSMaT geometry in terms of operation, one might also consider variants that achieve the same qualitative effect using other geometries. It may be possible to use only one magnetic layer in each magnetic stack in addition to the central ferromagnetic layer 101, simplifying the fabrication and the initial setting of the "fixed" magnets at the cost of reduced spin injection efficiency. Furthermore, if only one magnetic layer is used in each magnetic stack, it may be possible to use only the adjacent non-magnetic metal layer. The corresponding input and output terminals would be connected to the central easy-plane ferromagnetic regions. In one embodiment, PMA ferromagnet 104A and, if used, PMA ferromagnet 104B could be replaced by easy-plane ferromagnets with in-plane easy axis orthogonal, or nearly so, to easy-plane ferromagnet 101, where the device continues to work in essentially the same way as previously described. Similarly, PMA ferromagnet 108A and, if used, PMA ferromagnetic 108B could be replaced by easy-plane ferromagnets with in-plane easy axis orthogonal, or nearly so, to easy-plane ferromagnet 101. In one embodiment (if nonmetallic ferromagnetic layers have not already been used in part or whole for the easy-plane ferromagnet 101 as previously discussed), easy-plane ferromagnet 101 could be subdivided between magnetic stacks 105,109 via an interlaying or overlapping insulating ferromagnetic such that the resistance of the charge current conduction path between input and output is greatly increased. In one embodiment, the insulating ferromagnetic layer is YIG (yttrium iron garnet).

Figure 2:
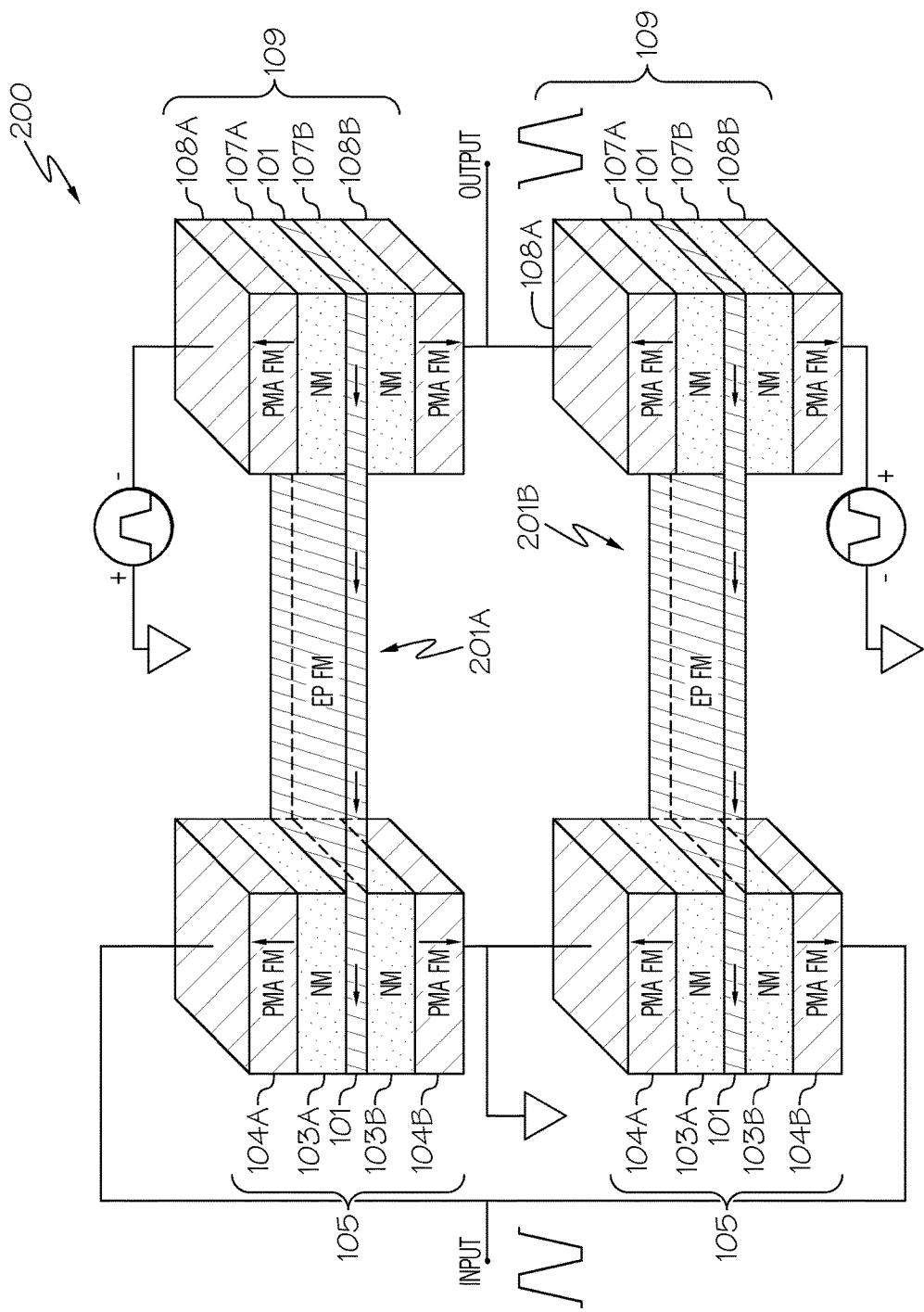
FIG. 2 illustrates the use of BiSMaTs as an inverter in accordance with an embodiment of the present invention.

Such BiSMaTs, along with clocked power supplies, can be used to form a full array of Boolean logic gates. FIG. 2 illustrates the use of BiSMaTs as an inverter 200 in accordance with an embodiment of the present invention. Referring to FIG. 2, C-BiSMaTs 201A, 201B are coupled together in the manner as shown in FIG. 2 to provide an inverter, where C-BiSMaTs 201A, 201B are configured similar to C-BiSMaT 100 as shown in FIG. 1A. (With regard to the inverter 200 of FIG. 2, those elements that are the same as C-BiSMaT 100 are referenced with the same element numbers as shown in FIG. 1A.)

Depending on the polarity of the current to the input (left hand side here), through critical current conservation with regard to the current driven through the two or more thin film magnetic stacks 105, 109, the apparent critical current as seen at the right hand side is altered. By first setting the input voltage high (or low), the operation point reached at the output upon raising the magnitude of, i.e., turning on the power supply voltages of opposite polarity, is forced low (or high), respectively, as described below.

Referring again to FIG. 2, the triangles indicate electrical grounds. The input voltage on the left to the two C-BiSMaTs 201A, 201B has positive (negative) polarity, which lowers (raises) the apparent critical current seen on the right side (now the output side) of the upper BiSMaT 201A, and raises (lowers) the apparent critical current seen on the right side of the lower BiSMaT 201B. The upper and lower power supplies on the right are clocked power supplies of positive and negative polarities, respectively, as shown. These power supply voltages are raised only once the inputs are set.

With a positive (negative) input voltage on the left, the apparent output side critical current on the right side of the upper BiSMaT 201A is lowered (raised) and the apparent output side critical current on the right side of the lower BiSMaT 201B is raised (lowered). With a positive (negative) input voltage, when the input voltage and the power supply voltages are raised, the upper BiSMaT 201A (lower BiSMaT 201B) reaches its apparent right side and actual total critical current first and goes into a high-resistance state, which reduces the current flow on the right and ensures that the lower BiSMaT 201B (upper BiSMaT 201A) is unable to reach its critical current and high resistance state. Therefore, most of the total voltage drop between the upper and lower power supplies is dropped across the upper BiSMaT 201A (lower BiSMaT 201B), and the output voltage has a negative (positive) polarity, confirming inversion of the positive (negative) input logic state.

Figure 3A:
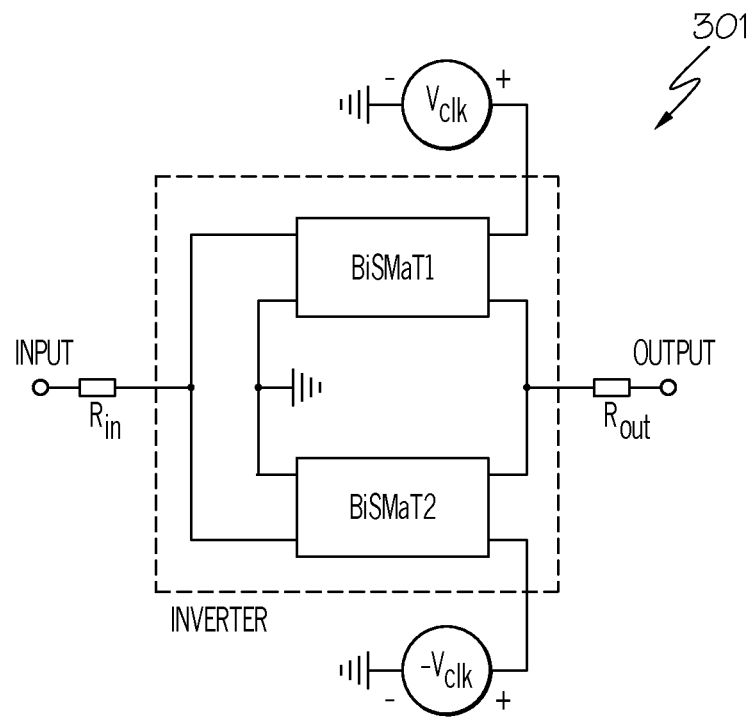
FIG. 3A illustrates an inverter using BiSMaTs consistent with FIG. 2 in accordance with an embodiment of the present invention.
Figure 3B:
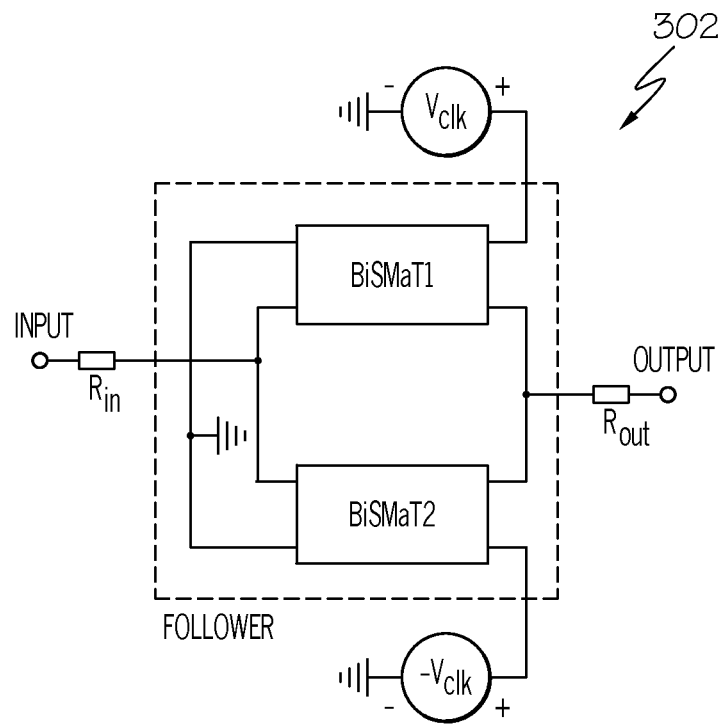
FIG. 3B illustrates a follower/buffer using C-BiSMaTs in accordance with an embodiment of the present invention.
Figure 3C:
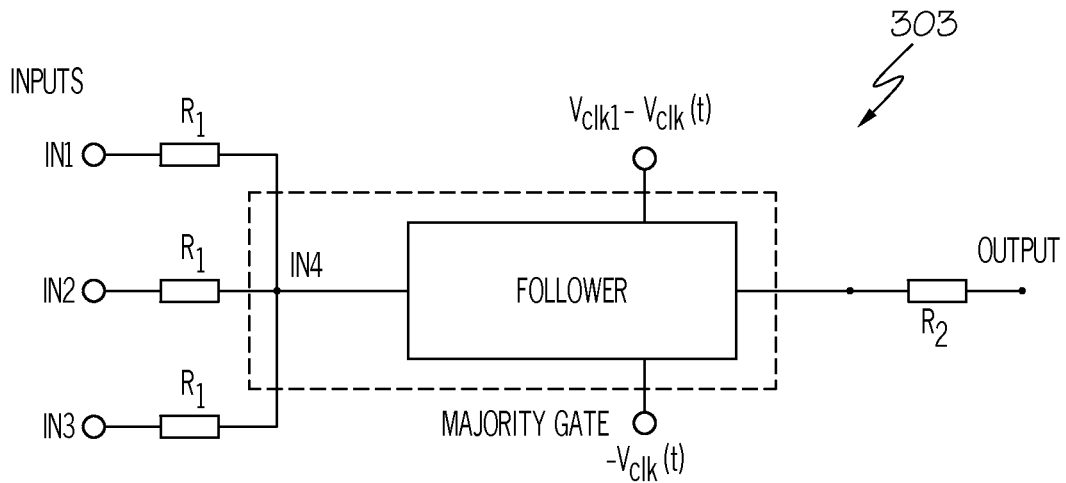
FIG. 3C illustrates a majority gate using the follower of FIG. 3B in accordance with an embodiment of the present invention.
Figure 3D:
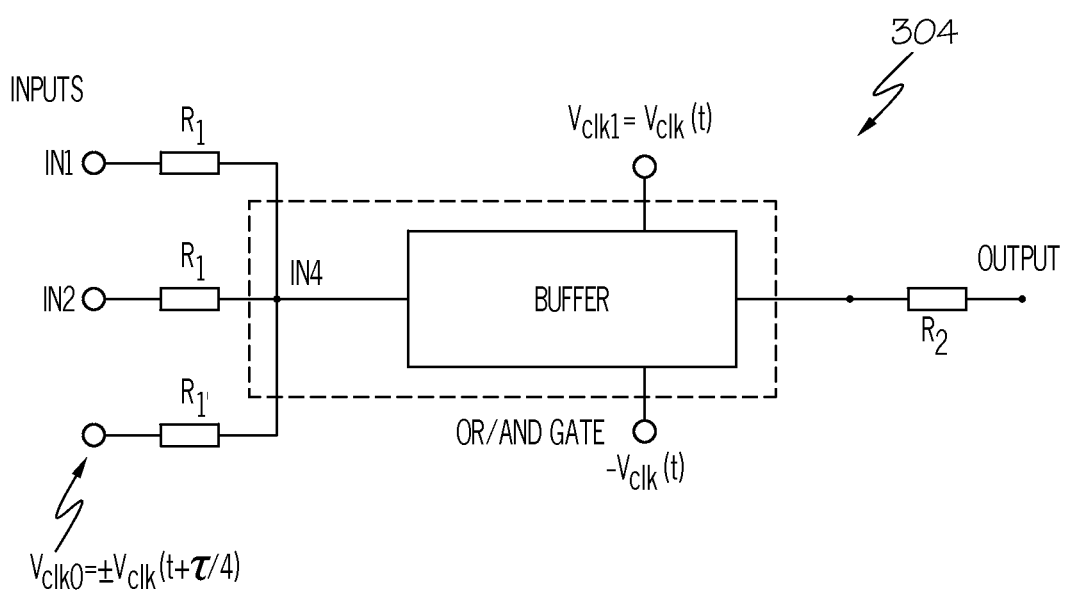
FIG. 3D illustrates switchable OR/AND gates formed with C-BiSMaTs and clocked power supplies in accordance with an embodiment of the present invention.

Other and more complicated Boolean gates can be created as shown in FIGS. 3A-3D. FIG. 3A illustrates an inverter 301 using C-BiSMaTs 100 consistent with the inverter 200 of FIG. 2 in accordance with an embodiment of the present invention. FIG. 3B illustrates a follower/buffer 302 using C-BiSMaTs 100 (FIG. 1A) in accordance with an embodiment of the present invention. FIG. 3C illustrates a majority gate 303 using the follower of FIG. 3B in accordance with an embodiment of the present invention. FIG. 3D illustrates a switchable OR/AND gate 304 formed using the follower of FIG. 3B in accordance with an embodiment of the present invention.

It is noted that the specific details regarding the functionality of FIGS. 3A-3D are not discussed in detail herein since it would be understood by one of ordinary skill and for the sake of brevity. It is further noted that the elements of FIGS. 3A-3D, such as the input resistance ($R_{in}$), the output resistance ($R_{out}$), the clock voltage ($V_{clk}$), resistances with a first value ($R_1$), resistance with an opposite value of the first value ($R_1'$), and resistances with a second value ($R_2$) are commonly understood by one of ordinary skill in the art and will be not be discussed herein for the sake of brevity.

Referring to FIGS. 3A-3D, in conjunction with FIG. 2, the majority gate 303 and switchable OR/AND gates 304 consist simply of follower/buffer gate cores of FIG. 3B with multiple input signals tied together to the single input of each BiSMaT 301A, 301B (identified as BiSMaT1 and BiSMaT2 which correspond to the structure of BiSMaT 201A, 201B of FIG. 2). However, to form the majority gate 303 and switchable OR/AND gates 304, the inputs also could be connected separately to BiSMaTs 201A, 201B with three-input metal-stacks. NOR/NAND and inverted-majority gates can be similarly created using an inverter core instead of a buffer core. If the clocked power supply in the follower or inverter core (core of follower 302 and inverter 301, respectively) is replaced with a stepped supply, in which the power is raised after the input signal is supplied but then held indefinitely afterwards, a latch or SRAM is obtained.

By using multi-phase power supplies, such as four phase clocked power supplies, with a time lag between cascaded gates, logical operations can be performed in a pipelined fashion. Moreover, each gate acts as its own nonvolatile latch in the sense that once the output signal/voltage is set, the input signal/voltage can be removed, which allows the previous gate to begin processing new information.

Because the output state is held once the power supplies are turned ON, and remains set independent of the input, these gates can also be used as static random access memories (SRAMs) and latches with the use of clocked power supplies in which the clocks are switched ON once the inputs are set but then held indefinitely.

In one embodiment, it may be possible to have multiple inputs to the same C-BiSMaT, where the sum of the input currents adjusts the critical current. Multiple inputs could provide additional logic and memory functionality.

Referring to FIGS. 1A, 2 and 3A-3D, in one embodiment of the C-BiSMaT, each one (or more) of the pairs of ferromagnetic and non-ferromagnetic layers 104A, 103A and 104B, 103B (if used) and 108A, 107A and 108B, 107B (if used) could be replaced by a co-planar non-magnetic metal exhibiting the spin Hall effect, in which the charge flow parallel to the boundary produces spin-polarized surface currents, and, thus, spin polarized charge injection into central easy-plane ferromagnet 101. In this embodiment, the contacts would be moved such that the current flows along the length of the spin-Hall layer before entering the adjacent magnetic layer 101. In one embodiment, these latter spin Hall metal layers would be the heavy metal tungsten (W). In one embodiment, these latter spin Hall metal layers would be the heavy metal platinum (Pt). In one embodiment, the ferromagnetic and non-ferromagnetic layers 104A, 103A and 104B, 103B (if used) and 108A, 107A and 108B, 107B (if used) of the C-BiSMaT could be replaced by a co-planar three-dimensional topological insulator (TI), which exhibits an exceptionally strong spin-Hall-like effect. In this embodiment, the contacts would be moved such that the current flows along the surface of the TI layer adjacent to the free magnetic layer 101 before entering the adjacent free magnetic layer 101. In three-dimensional TIs, the direction of charge movement and spin direction are helically locked on the surface, such that the spin orientation of the surface charge carriers is in plane and is defined within the plane by the direction of current flow on the surface of the TI. The spin orientation in plane as defined by the direction of the current flow should be oriented nearly orthogonally to central easy-plane ferromagnetic layer 101.

Figure 4A:
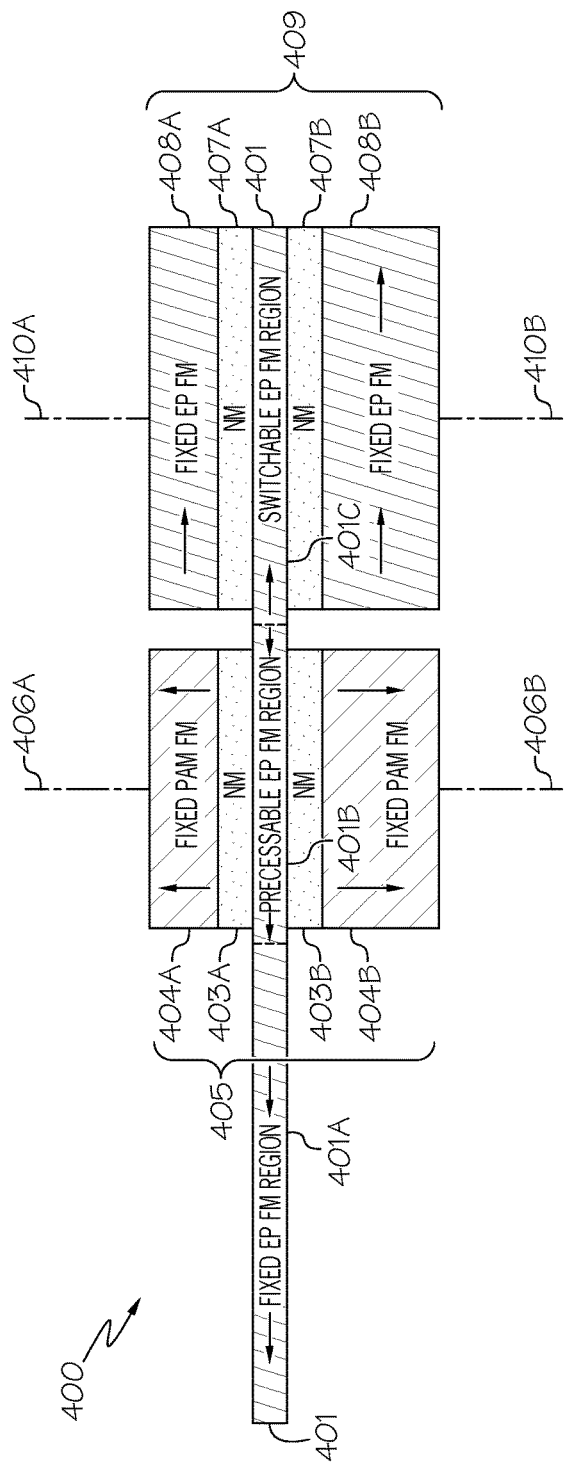
FIG. 4A illustrates a side view of the field-controlled (exchange field, or, alternatively, magnetic dipole field controlled with modifications) BiSMaT (referred to as the "F-BiSMaT"), which has a low-voltage non-volatile memory application in addition to and/or in combination with low-voltage logic applications, in accordance with an embodiment of the present invention.
Figure 4B:
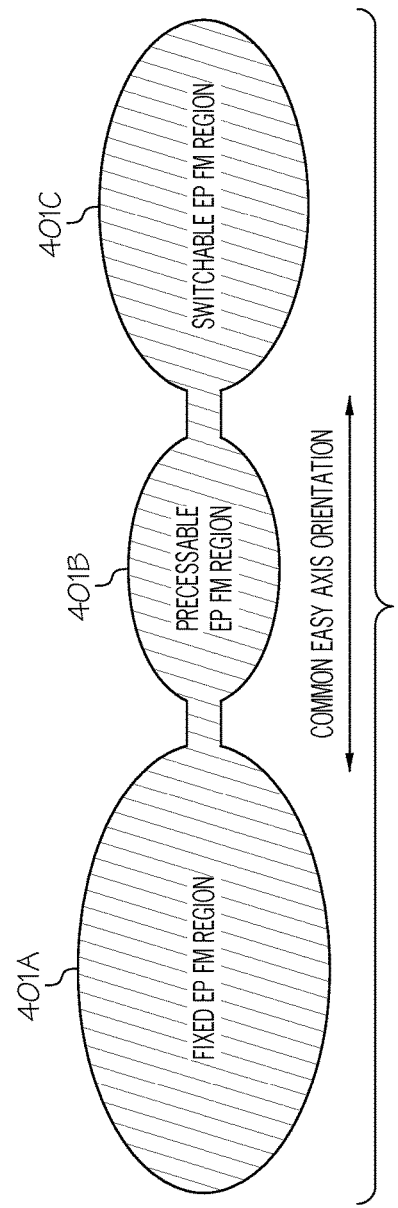
FIG. 4B illustrates a top view of the easy-plane central ferromagnetic of the F-BiSMaT and the included individual macrospin regions in accordance with an embodiment of the present invention.

Another basic version of the BiSMaT is the F-BiSMaT as illustrated in FIGS. 4A and 4B. In addition to logic and memory applications analogous to that of C-BiSMaT, the F-BiSMaT has intrinsic non-volatile logic and memory functions. FIG. 4A illustrates a side view of the field-controlled (exchange field, or, alternatively, magnetic dipole field controlled with modifications) BiSMaT (referred to as the "F-BiSMaT"), which has a low-voltage non-volatile memory application in addition to and/or in combination with low-voltage logic applications, in accordance with an embodiment of the present invention. FIG. 4B illustrates a top view of the easy-plane central ferromagnetic of the F-BiSMaT and the included individual macrospin regions in accordance with an embodiment of the present invention.

Referring to FIGS. 4A and 4B, like the C-BiSMAT, F-BiSMaT 400 includes an easy-plane (EP) ferromagnetic (FM) layer 401 driven by vertical charge transport through two (as shown here) or more thin film magnetic stacks 405 and 409. In contrast to the case for C-BiSMaT illustrated in FIG. 1A, central ferromagnetic layer 401 comprises two or more coupled easy-plane ferromagnetic regions, each of which approximates a single macrospin and shares a common easy axis orientation within the plane. In one embodiment, central ferromagnetic layer 401 comprises three such easy-plane ferromagnetic regions, namely 401A (identified as "fixed FM region"), 401B (identified as "precessable EP FM region") and 401C (identified as "switchable EP FM region") as illustrated in FIG. 4B. Collectively, the easy-plane ferromagnet regions, illustrated by regions 401A, 401B, 401C in FIG. 4B, may be referred to as the central easy-plane ferromagnetic layer or central easy-plane ferromagnetic thin film 401. However, in one embodiment, easy-plane ferromagnetic layer 401 can be formed from a continuous layer of ferromagnetic material, where the individual macrospin regions are defined by the in-plane geometry of the central easy-plane ferromagnetic layer, as illustrated by the top view of the easy-plane ferromagnet layer 401 in FIG. 4B, and/or defined by the out-of-plane geometry, such as by the thinning of the layer between the easy-plane regions within the easy-plane ferromagnetic layer 401. The principles of the present invention are not to be limited in scope to the use of a single layer of ferromagnetic material to form the central easy-plane ferromagnetic layer, and/or the use of in-plane geometry and/or the out-of plane geometry to define separate individual ferromagnetic regions within the easy-plane ferromagnetic layer 401. The principles of the present invention may include other geometries.

As further illustrated in FIG. 4A, magnetic stack 405 includes non-magnetic (NM) metallic layers 403A, 403B surrounding easy-plane ferromagnetic thin film 401. Furthermore, magnetic stack 409 includes non-magnetic metallic layers 407A, 407B surrounding easy-plane ferromagnetic thin film 401. Non-magnetic metal layers 403A, 403B may collectively or individually be referred to as non-magnetic layers 403 or non-magnetic layer 403, respectively. Furthermore, non-magnetic layers 407A, 407B may be referred to collectively or individually as non-magnetic layers 407 or non-magnetic layer 407, respectively.

Furthermore, as illustrated in FIG. 4A, magnetic stack 405 includes ferromagnetic layers 404A, 404B with PMA (at least with respect to the central easy-plane layer ferromagnetic layer 401) on the outside of non-magnetic layers 403. Furthermore, as shown in FIG. 4A, ferromagnetic layers 404A, 404B have opposite magnetic orientations (see arrows pointing in opposite direction in FIG. 4A). Ferromagnetic layers 404A, 404B may be referred to collectively or individually as ferromagnetic layers 404 or ferromagnetic layer 404, respectively. Furthermore, magnetic stack 409 includes (in contrast to the C-BiSMaT) easy-plane ferromagnetic layers 408A, 408B on the outside of non-magnetic layers 407. Easy-plane ferromagnetic layers 408A, 408B share a common in-plane easy axis with the switchable easy-plane ferromagnet 401C. Ferromagnetic layers 408A, 408B may be referred to collectively or individually as ferromagnetic layers 408 or ferromagnetic layer 408, respectively. Additionally, as illustrated in FIG. 4A, magnetic stack 405 has output terminals 406A, 406B, respectively. Output terminals 406A, 406B may be referred to collectively or individually as output terminals 406 or output terminal 406, respectively. Furthermore, as illustrated in FIG. 4A, magnetic stack 409 has input terminals 410A, 410B, respectively. Input terminals 410A, 410B may be referred to collectively or individually as input terminals 410 or input terminal 410, respectively.

Referring to FIGS. 4A and 4B, the role of the easy-plane ferromagnets 408A, 408B is to set the in-plane orientation of easy-plane ferromagnetic region 401C via spin-torque transfer due to a spin-polarized charge current running through input contacts 410A, 410B and input magnetic stack 409. Beyond an input switching current threshold, the current flow will switch easy-plane ferromagnet 401C. Input current flow in opposite directions will cause the easy-plane ferromagnetic region 401C to be set in opposite direction along the in plane easy axis. With the switchable easy-plane ferromagnet 401C preset, the switchable easy-plane ferromagnet 401C then controls the critical current for the onset of precession in easy-plane ferromagnet 401B and associated transition from high-to-low DC conductance between output contacts 406A and 406B through magnetic stack 405. Exchange coupling between ferromagnetic regions 401A and 401B will establish a preferred magnetic orientation along the easy axis of the easy-plane ferromagnetic region 401B. Depending on the magnetic orientation of the switchable ferromagnetic region 401C, exchange coupling between easy-plane ferromagnetic region 401B and switchable easy-plane ferromagnetic region 401C then either reinforces the preferred magnetic orientation along the easy axis of the easy-plane ferromagnetic region 401B increasing the critical current for the onset of precession, or weakens or eliminates the preferred magnetic orientation along the easy axis of the easy-plane ferromagnetic region 401B reducing the critical current for the onset of precession. Specifically, if switchable easy-plane ferromagnet 401A and fixed easy-plane ferromagnet 401C are aligned, easy-plane ferromagnet 401B will have a relatively larger critical current as compared to the case where switchable easy-plane ferromagnet 401A and fixed easy-plane ferromagnet 401C are anti-aligned. However, it is intended that neither the exchange coupling between easy-plane ferromagnet 401B and switchable easy-plane ferromagnet 401A, nor the exchange coupling between easy-plane ferromagnet 401B and switchable easy-plane ferromagnet 401A, nor the exchange coupling between easy-plane ferromagnet 401B and switchable easy-plane ferromagnet 401A combined with the exchange coupling between easy-plane ferromagnet 401B and switchable easy-plane ferromagnet 401A, is sufficient alone to change the magnetic orientation of easy-plane ferromagnets 401A, 401B, or 401C.

Because the magnetic orientation along the in-plane easy axis of ferromagnet 401C does not rely on continuing applied voltage or current once it is set, its state is non-volatile. Thus, the output state of the F-BiSMaT that will be read at the output terminals—high critical current or low critical current onset for precession and associated reduced DC conductance through the output contacts 406A, 406B beyond the critical current—is non-volatile, providing the basis for non-volatile logic and memory applications In particular, the output current of transistor 400 is controlled via an input current. The input current sets a magnetic orientation of a first region (e.g., region 401A) of easy-plane ferromagnetic film 401 via a spin transfer torque, where the magnetic orientation of the region of increases a strength of a magnetic orientation of a second region (e.g., region 401B) of easy-plane ferromagnetic film 401 in response to the first region of easy-plane ferromagnetic film 401 being aligned with the magnetic orientation of the second region of easy-plane ferromagnetic film 401 thereby increasing a critical current for subsequent current flow between the output terminals 406A, 406B or decreases a strength of a magnetic orientation of the second region of easy-plane ferromagnetic film 401 in response to the first region of easy-plane ferromagnetic film 401 being oppositely aligned with the magnetic orientation of the second region of easy-plane ferromagnetic film 401 thereby reducing the critical current for subsequent current flow between the output terminals 406A, 406B. As discussed above, in response to exceeding the critical current, easy-plane ferromagnetic film 401 produces an oscillatory precession about an out-of-plane axis by driving a current through magnetic stacks 405, 409 thereby increasing interlayer resistance of magnetic stacks 405, 409 and reducing current flow through magnetic stacks 405, 409 thereby producing a corresponding negative differential resistance.

Moreover, conventional spin-transfer-torque memory requires high-resistance tunnel barriers between the fixed ferromagnet(s) and the switchable magnet to allow reading of the magnetic state. Therefore, in conventional spin-transfer-torque memory relatively high voltages are required to drive enough current through the switchable ferromagnetic layer to switch it. In contrast, with the state of the device read via the onset precession of the output side easy-plane ferromagnet, non-magnetic metallic layers can be used between the ferromagnetic layers allowing much smaller voltages to be used to drive comparable currents, and, thus, much lower power operation. However, for non-volatile memory applications, such as for conventional spin transfer torque memory, the anisotropy energy of the input central easy-plane ferromagnetic region 401C should be large compared to the thermal energy $k_B T$ for thermal stability. For long-term memory applications, the anisotropy energy is commonly on the scale of 60 $k_B T$.

From a circuit point of view, it should be possible to use F-BiSMaT 400 in a similar way as C-BiSMaT 100 for logic, with the input current setting and holding the input state. In particular, F-BiSMaT 400 could be utilized in the logic gates discussed above in connection with FIGS. 3A-3D. In addition, however, since the input magnetic state remains even in the absence of an input current, the clocking scheme could be different. In one embodiment, a two-phase clock is used with each clock controlling alternate devices within a sequence, such that the signal is passed in a "leap-frog" pattern. Moreover, because the input of each F-BiSMaT 400 remains in the absence of a current, the logic circuit could have built-in non-volatile memory. However, in the latter case, the anisotropy energy again also should be large compared to the thermal energy $k_B T$ for thermal stability, at least for devices at critical logic points within the circuit.

In another embodiment, the output state of F-BiSMaT 400 can be read via the alternating current (AC) produced beyond the critical current as the easy-plane ferromagnetic region 401B processes. In one embodiment, the AC current produce beyond the critical current would be passed through an in-series capacitor connected to one of the outputs of the logic element, and subsequently rectified. This determining of output state via the AC current produced beyond the critical current is envisioned to be perhaps most useful for memory applications, and could provide significantly larger ON-OFF ratio in terms of the AC current—for which there should be none other than the Fourier components of the switching transient prior to reaching the critical current—than in terms of the change in DC current about the critical current point.

In one embodiment, for memory applications, the upper input terminal 410A and upper output terminal 406A could be grounded together, and the lower input terminal 410B and lower output terminal 406B could be grounded together. In this way, only two contacts would be required. The magnetic orientation of the easy-plane ferromagnetic region 401C could be defined by an applied current, even while easy-plane ferromagnetic region 401B is pushed beyond its critical current to no significant effect on the setting of region 401C other than an overall larger required current. Then the critical current of region 401B could be read subsequently via a lower current via either its DC or AC current.

It is noted that various materials can be employed. In one embodiment, easy-plane ferromagnets 401A, 401B, 401C are composed of a metal (e.g., iron, cobalt, nickel), a ferromagnetic insulator (e.g., yttrium iron garnet (YIG)), a combination of metals and ferromagnetic insulators, an alloy (e.g., permalloy (nickel-iron (Ni—Fe))), or a layer structure (e.g., cobalt (Co) on platinum (Pt), cobalt-platinum multilayers). In one embodiment, the non-magnetic layers 403A, 403B, 407A, 407B are composed of a metal (e.g., copper, gold) or an insulator (e.g., MgO). In one embodiment, the PMA ferromagnetic layers 404A, 404B are composed of a metal (e.g., iron, cobalt, nickel), a ferromagnetic insulator (e.g., yttrium iron garnet (YIG)), an alloy (e.g. permalloy), or a layer structure (e.g., cobalt (Co) on platinum (Pt), cobalt-platinum multilayers). In one embodiment, easy-plane ferromagnets 408A, 408B are composed of a metal (e.g., iron, cobalt, nickel), a ferromagnetic insulator (e.g., yttrium iron garnet (YIG)), an alloy (e.g., permalloy), or a layer structure (e.g., cobalt (Co) on platinum (Pt), cobalt-platinum multilayers). It is noted that the principles of the present invention are not to be limited in scope to the materials discussed above and that other materials may be utilized Furthermore, various geometries can be employed. In one embodiment, the central easy-plane ferromagnetic layers 401A, 401B, 401C may be approximately rectangular in the plane. In one embodiment, the central easy-plane ferromagnetic regions 401A, 401B, 401C may be approximately oval in the plane. The principles of the present invention are not to be limited in scope to having central easy-plane ferromagnetic layers 401A, 401B, 401C being rectangular or oval in the plane. Other geometries for central easy-plane ferromagnetic layers 401A, 401B, 401C may be utilized.

In one embodiment, beyond the central easy-plane layer, the output magnetic stack 405 may be square in the plane. In one embodiment, beyond the central easy-plane layer, the output magnetic stack 405 may be round in the plane. In one embodiment, beyond the central easy-plane layer, the output magnetic stack 405 may be oval in the plane. The principles of the present invention are not to be limited in scope to having magnetic stack 405 being square, round or oval in the plane beyond the central easy-plane layer. Other geometries for magnetic stack 405 beyond the central easy-plane layer may be utilized.

In one embodiment of the current invention, beyond the central easy-plane layer, the input magnetic stack 409 may be rectangular in the plane. In one embodiment, beyond the central easy-plane layer, the input magnetic stack 409 may be oval in the plane. The principles of the present invention are not to be limited in scope to having magnetic stack 409 being rectangular or oval in the plane beyond the central easy-plane layer. Other geometries for magnetic stack 409 beyond the central easy-plane layer may be utilized.

In one embodiment, central easy-plane ferromagnetic region 401C may be larger than and/or have greater shape anisotropy than central easy-plane ferromagnetic region 401B, where, for example, region 401C may be subject to thermal stability requirements for nonvolatile logic and memory applications to which region 401B is not. Similarly, fixed central easy-plane ferromagnetic region 401A may be larger and/or have greater shape anisotropy than central easy-plane ferromagnetic region 401B. The principles of the present invention are not to be limited in scope to such relative sizes and shapes.

In the easy-plane ferromagnetic regions 401A, 401B, 401C, magnetic anisotropy, such as shape anisotropy for rectangular or oval ferromagnetic layers, is assumed to produce an easy axis for magnetization within the plane. In one embodiment of the easy-plane ferromagnetic 401B, magnetic anisotropy, such as shape anisotropy, is assumed to produce not merely an easy axis for magnetization within the easy-plane but a single preferred direction for magnetic orientation with the easy-plane. In this way, in one embodiment of F-BiSMaT 400, the easy-plane ferromagnetic region 401A becomes unnecessary and can be eliminated The relative positions of the easy-plane central ferromagnetic regions 401B, 401C and 401A can also be varied. One or both central easy-plane ferromagnetic regions 401A, 401C could be aligned end-to-end with central easy-plane ferromagnetic region 401C with respect to their common easy axis orientation, as illustrated in FIG. 4B. One or both central easy-plane ferromagnetic regions 401A, 401C could be aligned side-to-side with central easy-plane ferromagnetic region 401C with respect to their common easy axis orientation. One or both central easy-plane ferromagnetic regions 401A, 401C could be aligned on a diagonal with central easy-plane ferromagnetic region 401C with respect to their common easy axis orientation. Regions 401C and 401A may only share (within a reasonable approximation) a common easy-axis orientation with and be coupled to region 401B as previously described.

In one embodiment of F-BiSMaT 400, one or more dielectric tunnel barriers are used within the nominally magnetic stacks 405 and 409 in lieu of or in addition to the non-ferromagnetic layers 403, 407 to decrease the conductances $g_L$ and $g_R$ and to adjust the transition voltage $\delta V$ upward to within a higher desired voltage range, such as to address noise considerations.

In one embodiment, the central easy-plane thin film ferromagnetic regions 401A, 401B, and/or 401C are composed of a nonmetallic material rather than a metallic material. Nonmetallic ferromagnetic layers generally have smaller Gilbert damping coefficients to increase the ratio between the DC conductance prior to reaching the critical current and after reaching the critical current. Moreover, because coupling from central easy-plane ferromagnetic region 401B to central easy-plane ferromagnetic regions 401A and 401B may provide damping as well, minimization of Gilbert damping for the central easy-plane ferromagnetic film 401 may be more beneficial for the F-BiSMaT than for the C-BiSMaT, particularly so for region 401B which undergoes precession.

However, use of a non-metallic layer would reduce the conductances $g_L$ and $g_R$, and, thus, increase the required operating voltage substantially (which might or might not be beneficial). In one embodiment, the thin film ferromagnetic regions 401A, 401B, 401C are composed of a nonmetallic material with one or more metallic ferromagnetic vias coupling non-magnetic metallic layers 403A, 403B through the otherwise nonmetallic ferromagnetic region 401B and/or with one or more metallic ferromagnetic vias coupling non-magnetic metallic layers 407A, 407B through the otherwise nonmetallic ferromagnetic region 401C. The host nonmetallic ferromagnetic film and the metallic vias should be strongly exchange coupled so that the combination continues to approximate a single macrospin for the individual regions 401B, 401C. This latter approach would still provide a reduced Gilbert damping coefficient (if less so than for a pure insulating ferromagnetic layer 401) while maintaining high conductivities $g_L$ and $g_R$. In one embodiment, the thin film nonmetallic layer consists of YIG (yttrium iron garnet). In one embodiment, the metallic ferromagnetic vias are composed of permalloy (Ni—Fe).

Referring to FIG. 4A, in one embodiment, output PMA ferromagnetic layers 404A, 404B require different magnetic fields to set the "fixed" magnetic orientations of the layers thereby allowing their opposite magnetic orientations to be set more readily. In one embodiment, input fixed easy-plane ferromagnetic layers 408A, 408B require different magnetic fields to set the "fixed" magnetic orientations of the layers thereby allowing their magnetic orientations to be set more readily.

The discussion of alternative geometries and materials for F-BiSMaT 400 is much the same as for C-BiSMaT 100. Although the basic structure as described above and illustrated in FIGS. 4A and 4B currently seems to be the most promising F-BiSMaT geometry in terms of operations, one might also consider variants that achieve the same qualitative effect using other geometries. It may be possible to use only one ferromagnetic layer in each magnetic stack in addition to the central ferromagnetic layer 401, simplifying the fabrication and the initial setting of the "fixed" magnets at the cost of reduced spin injection efficiency. Furthermore, if only one magnetic layer is used in each magnetic stack, it may be possible to use only the adjacent non-magnetic metal layer. The corresponding input and output terminals would be connected to the corresponding central easy-plane ferromagnetic regions. In one embodiment, PMA ferromagnets 404A, and, if used, 404B could be replaced by easy-plane ferromagnets with in-plane easy axis orthogonal, or nearly so, to easy-plane ferromagnet 401, where the device continues to work in essentially the same way as previously described. In one embodiment (if nonmetallic ferromagnetic layers have not already been used in part or whole for the easy-plane ferromagnet 401 as previously discussed), the easy-plane ferromagnet 401 could be subdivided between magnetic stacks 405 and 409 via an interlaying or overlapping insulating ferromagnetic such that the resistance of the charge current conduction path between input and output is greatly increased. In one embodiment, the insulating ferromagnetic layer is YIG (yttrium iron garnet). In one embodiment, the central easy-plane thin film ferromagnet of layer 401 is composed of a metallic or nonmetallic antiferromagnetic material rather than a ferromagnetic material. Antiferromagnetic materials have the advantage that they have more rapid precessional dynamics. Less time is therefore required to establish a well-defined time-averaged current. This embodiment will be advantageous when rapid device speed is desirable.

In one embodiment, each one (or more) of the pairs of ferromagnetic and non-ferromagnetic layers 404A, 403A and 404B, 403B (if used) and 408A, 407A and 408B, 407B (if used) could be replaced by an appropriately physically oriented co-planar non-magnetic metal exhibiting the spin-Hall effect, in which charge flow parallel to the boundary produces spin-polarized surface currents, and, thus, spin polarized charge injection into the central easy-plane ferromagnet 401. In this embodiment, the contacts would be moved such that the current flows along the length of the spin-Hall layer before entering the adjacent free magnetic layer 101. In one embodiment, these latter spin-Hall metal layers would be the heavy metal tungsten (W). In one embodiment, these latter spin-Hall metal layers would be the heavy metal platinum (Pt). In one embodiment, each one (or more) of the pairs of ferromagnetic and non-ferromagnetic layers 404A, 403A and 404B, 403B (if used) and 408A, 407A and 408B, 407B (if used) could be replaced by an appropriately oriented three-dimensional topological insulator (TI), which exhibit and exceptionally strong spin-Hall-like effect. In this embodiment, the contacts would be moved such that the current flows along the surface of the TI layer adjacent to the free magnetic layer 101 before entering the adjacent free magnetic layer 401. In three-dimensional TIs, the direction of charge movement and spin direction are helically locked on the surface, such that the spin orientation of surface charge carriers is in plane and is defined within the plane by the direction of current flow on the surface of the TI. The spin orientation in the plane as defined by the direction of current flow should be oriented nearly orthogonally to the easy axis of central easy-plane ferromagnetic layer 401.

Moreover, although coupling magnetics regions 401B and 401C to each other and coupling magnetic regions 401B and 401A (if used) to each other through exchange interactions (exchange field) within a continuously ferromagnetic region (if perhaps composed of two or more ferromagnetic materials in physical contact with each other as previously described) currently seems to be the most promising geometry in terms of operations, one may also consider other approaches that achieve the same qualitative effect. One may consider exchange coupling over a larger boundary between regions through a very thin—angstrom scale is to be expected—non-magnetic material or even insulating materials. More fundamentally, one may be able to use magnetic dipole interactions among easy-plane ferromagnetic (approximately) macrospin regions 401B, 401C, 401A in lieu of the exchange interactions. Using dipole interactions, the easy-plane ferromagnetic macrospin regions 401B, 401C, 401A could be physically disconnected, although still in close proximity. However, in contrast to the case for exchange coupling, adjacent regions 401B and 401C would have a preferred anti-parallel magnetic alignment if aligned side-by-side with respect to their common easy-plane axis orientation. Similarly, adjacent regions 401B and 401A (if used) would have a preferred anti-parallel magnetic alignment if aligned side-by-side with respect to their common easy-plane axis orientation.

In one embodiment, it may be possible to have multiple inputs to the same F-BiSMaT, where the sum of the input currents adjusts the critical current. Multiple inputs would allow for additional logic functionality.

In one embodiment, a third magnetic stack representing a second input magnetic stack, which is physically identical to input magnetic stack 409 or variations thereof as discussed above, could be sandwiched around ferromagnetic region 401A that will not also be taken to be identical to region 401C. In this way, if the input currents to both magnetic stacks are of the same sign, the central easy-plane regions 401A and 401C will be magnetically oriented in the same direction. Exchange coupling between central easy-plane ferromagnetic regions 401A and 401B and exchange coupling between central easy-plane ferromagnetic regions 401C and 401B will work together to establish a preferred magnetic orientation for central easy-plane ferromagnetic region 401B, and, thus, a relatively large critical current for current flow through output magnetic stack 405. If the input currents to both magnetic stacks are of opposite sign, the central easy-plane regions 401A and 401C will be magnetically oriented in opposite directions. Exchange coupling between central easy-plane ferromagnetic regions 401A and 401B and exchange coupling between central easy-plane ferromagnetic regions 401C and 401B will work against each other, reducing or eliminating any preferred magnetic orientation for central easy-plane ferromagnetic region 401B, and, thus, establishing a relatively small critical current for current flow through output magnetic stack 405. Thus, these multiple inputs provide a pathway to exclusive OR or exclusive NOR functionality.

Referring to FIGS. 1A and 4A, these devices, the C-BiSMaT and the F-BiSMaT, could use fabrication techniques similar to those used for other spin logic and memory devices. For optimal BiSMaTs, one needs to maximize the conductance drop beyond the critical voltage/current point for low critical voltages. In this case, the operating voltages could be on the millivolt scale or less. Optimizing the ON/OFF ratio can be achieved by asymmetric right and left electrodes and by decreasing the rate at which spins flip due to the Gilbert damping processes in the magnetic material. For a given material, the Gilbert damping parameter is approximately constant. Minimizing the Gilbert damping can then be achieved by minimizing the volume of the easy-plane magnet. Use of non-metallic ferromagnetic layers with the central layer 101 or regions 401A, 401B and 401C in whole or in part could minimize the Gilbert damping coefficient. For given magnetic stack areas, the volume can be adjusted by reducing the layer thickness. An ultrathin central layer therefore both enables large ON/OFF ratios, and, for a metallic central layer, helps prevent cross-talk between the input and output contacts in C-BiSMaT 100 or F-BiSMaT 400. While increasing the separation would reduce crosstalk between the input and output, the contacts should cover as much of the central ferromagnetic layers as otherwise possible to minimize the output contact conductance relative to the Gilbert damping process. Similarly, for a large ON/OFF current ratio for C-BiSMaT 100, a relatively large contact area should be maintained on the output side as compared to the input side. For C-BiSMaT 100, the up and down oriented ferromagnetic layers should have different magnetic moments to allow them to be separately set (permanently or quasi-permanently) via externally applied magnetics fields. For example, a large magnetic field in one direction can be used to set both top and bottom vertically oriented magnets to have the same direction, followed by a weaker reverse field to reset only the magnetic orientations of the magnets of the smaller magnetic moment, thus achieving the opposite magnetic orientations. For F-BiSMaT 400, the oppositely oriented vertically aligned fixed ferromagnets 404A, 404B similarly should have different magnetic moments to allow their magnetic orientations to be set similarly by a vertically aligned externally applied magnetic field. For F-BiSMaT 400, the oppositely oriented in-plane aligned fixed ferromagnets 408A, 408B should have different magnetic moments to allow their magnetic orientations to be set similarly by a horizontally/in-plane aligned externally applied magnetic field. Functionally, it is possible to use only one vertically aligned fixed magnet in each magnetic stack of C-BiSMAT 100, or to use one vertically fixed aligned in the output stack and one in-plane (horizontally) aligned fixed ferromagnet, as previously noted, simplifying both fabrication and the initial setting of magnets. A drawback of this latter approach would be some loss of efficiency.

CMOS logic circuits and even associated memory, such as static random access memory (SRAM), are designed in such a way that in any logic state under steady-state conditions, there is always one OFF-state transistor in series between the supply voltage and ground, so that only OFF-state leakage currents flow under steady-state conditions. Large currents flow during switching transients, and are required to charge the gates of subsequent transistors and interconnects quickly. However, to minimize power consumption in CMOS logic where the transistors are only switching for a very small fraction of the time on average, transistor ON-OFF current ratios of multiple orders of magnitude (multiple factors of ten) still must be achieved to control OFF-state power consumption. To achieve these ratios subject to the optimal $2.3k_B$ T/q (natural log of 10 times Boltzmann's constant times temperature in degrees Kelvin, all divided by the magnitude of the charge of an electron) per decade switching and also provide enough ON-state current for switching, approximately half a Volt change in the gate voltage between the ON and OFF states is required under normal operating conditions (where the actual change possible in a CMOS circuit is defined by the power supply voltage), a lower limit that should be reached somewhere around the end of the next decade. However, the energy consumed during switching increases as the square of the supply voltage. Thus, historically, as device density has increased in logic circuits, not only have device dimensions been reduced, but also supply voltages. This inability to further scale supply voltages beyond this point represents a major roadblock to the continued improvement in the computational capabilities and energy efficiency of future logic circuits employing MOSFETs.

BiSMaTs have completely different current-voltage characteristics and different operational physics compared to MOSFETs, and allow for ultralow-voltage operation, perhaps on the scale of a millivolt (mV) or less, and require radically different ways of implementing digital logic. The current-voltage characteristics of these devices provide an example of an electron transport phenomenon in which a collective degree-of-freedom, the magnetization orientation, plays an active role.

This type of phenomenon is of potential interest for electronic device applications because it can lead to current flow response to bias voltage change that is sharp on scales smaller than $k_BT/q$, an impossibility for the single-particle charge transport processes exploited in most current electronic devices. By providing a mechanism of control over current in BiSMaTs that is not subject to charged particle thermionic emission, switching over much smaller voltages may be allowed, perhaps on the scale of a few mV or less, allowing for much more energy efficient device operation. Furthermore, the associated reduction in power dissipation should then allow for greater device density, and, thus, increased computational power in CMOS-like logic circuits.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A transistor, comprising:
an easy-plane ferromagnetic film with an orientation along an easy axis within a plane of a ferromagnet driven by vertical charge transport through a first and a second metal stack;
said first metal stack comprising a first non-magnetic layer directly contacting an upper surface of said easy-plane ferromagnetic film and a second non-magnetic layer directly contacting a lower surface of said easy-plane ferromagnetic film, wherein said first metal stack further comprises a first and a second ferromagnetic layer on an outside of said first and second non-magnetic layers;
said second metal stack comprising a third non-magnetic layer directly contacting said upper surface of said easy-plane ferromagnetic film and a fourth non-magnetic layer directly contacting said lower surface of said easy-plane ferromagnetic film, wherein said second metal stack further comprises a third and a fourth ferromagnetic layer with perpendicular anisotropy on an outside of said third and fourth non-magnetic layers;
input terminals connected to said first and second ferromagnetic layers of said first metal stack; and
output terminals connected to said third and fourth ferromagnetic layers of said second metal stack.

2. The transistor as recited in claim 1, wherein in response to exceeding a critical current, said easy-plane ferromagnetic film produces an oscillatory precession about an out-of-plane axis by driving a current through said first and second metal stacks thereby increasing interlayer resistance of said first and second metal stacks and reducing current flow through said first and second metal stacks, wherein said critical current corresponds to a conserved quantity with respect to a sum of current flows through an upper output terminal and an upper input terminal in response to said first and third ferromagnetic layers of said first and second metal stacks, respectively, having a same magnetic orientation, or corresponds to a conserved quantity with respect to a sum of current flows through the upper output terminal and a lower input terminal in response to said first and third ferromagnetic layers of said first and second metal stacks, respectively, having a different magnetic orientation.

3. The transistor as recited in claim 1, wherein said first and second ferromagnetic layers have opposite magnetic orientations, wherein said third and fourth ferromagnetic layers have opposite magnetic orientations.

4. The transistor as recited in claim 1, wherein said first ferromagnetic layer and said third ferromagnetic layer have a same magnetic orientation, wherein said second ferromagnetic layer and said fourth ferromagnetic layer have the same magnetic orientation.

5. The transistor as recited in claim 1, wherein said first ferromagnetic layer and said third ferromagnetic layer have a different magnetic orientation, wherein said second ferromagnetic layer and said fourth ferromagnetic layer have different magnetic orientations.

6. The transistor as recited in claim 1, wherein said easy-plane ferromagnetic film comprises permalloy.

7. The transistor as recited in claim 1, wherein said first, second, third and fourth non-magnetic layers comprise a metal or an insulator.

8. The transistor as recited in claim 1, wherein said first, second, third and fourth ferromagnetic layers comprise a metal, an alloy or a ferromagnetic insulator.

9. The transistor as recited in claim 1, wherein said easy-plane ferromagnetic film is rectangular or oval in said plane.

10. The transistor as recited in claim 9, wherein said first and second metal stacks are rectangular or round in a plane beyond said plane of said ferromagnet.

11. The transistor as recited in claim 1, wherein said transistor is utilized in one of the following: an inverter, a follower, a majority gate and a switchable OR/AND gate.

12. The transistor as recited in claim 1, wherein said easy-plane ferromagnetic film comprises two or more ferromagnetic regions each of which individually approximates a macrospin.

13. The transistor as recited in claim 12, wherein an output current of said transistor is controlled via an input current, wherein said input current sets a magnetic orientation of a first region of said easy-plane ferromagnetic film via spin transfer torque, wherein a magnetic orientation of said first region of said easy-plane ferromagnetic film increases a strength of a magnetic orientation of a second region of said easy-plane ferromagnetic film in response to said first region of said easy-plane ferromagnetic film being aligned with said magnetic orientation of said second region of said easy-plane ferromagnetic film thereby increasing a critical current for subsequent current flow between said output terminals or decreases a strength of said magnetic orientation of said second region of said easy-plane ferromagnetic film in response to said first region of said easy-plane ferromagnetic film being oppositely aligned with said magnetic orientation of said second region of said easy-plane ferromagnetic film thereby reducing said critical current for subsequent current flow between said output terminals, wherein in response to exceeding said critical current, said easy-plane ferromagnetic film produces an oscillatory precession about an out-of-plane axis by driving a current through said first and second metal stacks thereby increasing interlayer resistance of said first and second metal stacks and reducing current flow through said first and second metal stacks thereby producing a corresponding negative differential resistance.

14. The transistor as recited in claim 12, wherein said third and fourth ferromagnetic layers have opposite magnetic orientations.

15. The transistor as recited in claim 12, wherein said easy-plane ferromagnetic film comprises permalloy.

16. The transistor as recited in claim 12, wherein said first, second, third and fourth non-magnetic layers comprise a metal or an insulator.

17. The transistor as recited in claim 12, wherein said third and fourth ferromagnetic layers comprise a metal, an alloy or a ferromagnetic insulator.

18. The transistor as recited in claim 12, wherein said easy-plane ferromagnetic film is rectangular or oval in said plane of said ferromagnet.

19. The transistor as recited in claim 18, wherein said first metal stack is rectangular or oval in a plane beyond said plane of said ferromagnet.

20. The transistor in claim 18, wherein said second metal stack is square, round or oval in a plane beyond said plane of said ferromagnet.

21. The transistor as recited in claim 12, wherein said transistor is utilized in one of the following: an inverter, a follower, a majority gate and a switchable OR/AND gate.

22. The transistor as recited in claim 12, wherein said transistor is utilized in non-volatile memory.

* * * * *